United States Patent [19]
Elhatem et al.

[11] Patent Number: 5,258,638
[45] Date of Patent: Nov. 2, 1993

[54] THERMAL INK JET POWER MOS DEVICE DESIGN/LAYOUT

[75] Inventors: Abdul M. Elhatem, Hawthorne; Steven A. Buhler, Redondo Beach, both of Calif.

[73] Assignee: Xerox Corporation, Stamford, Conn.

[21] Appl. No.: 928,597

[22] Filed: Aug. 13, 1992

[51] Int. Cl.$^5$ ............ H01L 27/01; H01L 29/00; H01L 29/78

[52] U.S. Cl. .................... 257/401; 257/259; 257/262; 257/287; 257/343

[58] Field of Search ............ 257/206, 207, 208, 211, 257/259, 261, 262, 270, 275, 287, 288, 331, 341, 342, 343, 365, 366, 390, 401, 339, 393, 409, 209, 210

[56] References Cited

U.S. PATENT DOCUMENTS

| | | | |
|---|---|---|---|
| 3,414,781 | 12/1968 | Dill | 257/401 |
| 3,449,648 | 6/1969 | Beale et al. | 257/262 |
| 3,586,930 | 6/1971 | Das | 257/401 |
| 3,643,139 | 2/1972 | Nienhuls | 257/401 |
| 4,025,940 | 5/1979 | Kimura et al. | 257/401 |
| 4,462,041 | 7/1984 | Glen | 257/401 |
| 4,684,965 | 8/1987 | Tajima et al. | 257/259 |

*Primary Examiner*—Andrew J. James
*Assistant Examiner*—Alice Hsuanchen Wu
*Attorney, Agent, or Firm*—Fariba Rad

[57] ABSTRACT

A layout of a MOSFET current driver is disclosed which improves the fabrication yield and the current drive capability over that of the prior art while keeping the layout area the same as the prior art. In this design, the gate is laid out to have a lateral serpentine pattern rather than a vertical serpentine pattern to create a larger gate in order to improve the current drive capability. In addition, the contacts for the drain and the contacts for the source are removed from the gate layout area which facilitates condensing the gate layout and increasing the size of the gate. Also, this design has only two metal strips: one for the drain and one for the source of the MOSFET current driver. The two metal strips substantially overlap the serpentine patterned gate. Having only two metal strips reduces the spaces between the metal strips to one space thereby reducing the probability of having a short or a defect and improving the fabrication yield.

4 Claims, 4 Drawing Sheets

THERMAL INK JET POWER MOS DEVICE DESIGN/LAYOUT

BACKGROUND OF THE INVENTION

This invention relates to a design of a heating unit of a thermal ink jet and more specifically to a layout of a power driver of the heating unit for providing more current drive capability to a heating element in the heating unit.

Generally, an ink jet printing system has a printhead which comprises one or more ink filled channels communicating with an ink supply chamber at one end and having a nozzle opening at the opposite end. A heating element is placed at the bottom of a bubble containment chamber which in turn is located at a predetermined distance from the nozzle. A flow of an electric current through the heating element, which is a resistive element, heats up the heating element vaporizing the ink in the chamber and forming a bubble. As the bubble grows, the ink is ejected out of the nozzle. By stopping the current flow, the heating element cools off causing the bubble to collapse. While the bubble is collapsing, the ink at the vicinity of the nozzle is pulled in resulting in drop ejection by separation of the ink outside of the nozzle from the ink inside of the nozzle.

The width of a heating unit is limited to the nozzle width and the width of the nozzle is limited to the pixel width. As the number of the pixels in each printing system grows, the allocated space to each pixel decreases thereby decreasing the allocated width of each nozzle and each heating unit. A 300 dot per inch (DPI) printing allocates 84 micron layout width and a 600 DPI printing allocates 42 micron layout width.

Referring to FIG. 1, a heating unit 10 comprises a resistor 12 for heating and a current driver, usually a MOSFET (metal oxide silicon field-effect transistor) 14. The drain 16 of the n-channel MOSFET 14 is connected to a power supply $V_{DD}$ through the resistor 12, the source 18 of the MOSFET 14 is connected to ground potential, and the gate 20 is connected to an input drive circuitry (not shown) through an input $V_i$.

With a growing need for faster printing engines, the need for more powerful heating units is also growing. To fabricate a more powerful heating unit 10, a current driver with a higher current drive capability is required. Moreover, to fabricate a current driver with a higher current drive capability a larger MOSFET 14 is needed which in turn requires a larger gate 20. To layout a larger gate 20, the layout area of the heating element has to be increased. Since the width of the layout area of the heating unit is limited, only the length of the layout area can be increased.

Referring to FIG. 2, the conventional MOSFET current drivers are laid out to have a gate 20 with a vertical serpentine pattern. The serpentine pattern is laid out to have a plurality of long strips 21 parallel to each other along the length of the layout of the current driver 14. Also, the serpentine pattern has a plurality of short strips 15 which connect the long strips to each other in such a manner to generate a long continuous gate. The serpentine pattern of the conventional layout is called vertical since the long strips 21 are laid out along the length of the layout of the current driver 14. The drain area 16 and source area 18 are located between the long strips 21 of the gate 20 in an interlace form. The drain metal 17 has a plurality of fingers 22 and the source metal 19 has a plurality of fingers 24. The drain fingers 22 and the source fingers 24 are laid out in such a manner that they are in an interlace relationship with each other and each drain finger 22 is located above a drain area 16 and each source finger 24 is located above a source area 18. Each drain finger 22 has plurality of contacts 26 with the drain area 16 underneath the drain finger 22. Each source finger 24 has plurality of contacts 28 with the source area 18 underneath the source finger 24.

The conventional MOSFET current driver layout is prone to have shorts or defects. The multiplicity of the drain and the source fingers and the multiplicity of the spaces between the drain fingers 22 and the source fingers 24 gives rise to the probability of having a short or a defect. Therefore, the fabrication yield of this design is very low.

SUMMARY OF THE INVENTION

The present invention is directed to the design of a layout of a MOSFET current driver which improves the fabrication yield and the current drive capability while keeping the layout area the same. In this design, the gate is laid out along the width of the current driver rather than along the length of the current driver. Also, in this design, the metal fingers of the conventional design are replaced by only two trapezoidal metal strips: one for the drain and one for the source of the MOSFET current driver.

In accordance with one aspect of this invention, by replacing the metal fingers of the conventional design by two metal strips, the multiplicity of the spaces between the metal fingers, which gives rise to the probability of having a short or a defect, is reduced to one space. Therefore, by reducing the probability of having a short or a defect the fabrication yield is improved.

In accordance with another aspect of this invention, the two metal lines are designed to have a trapezoidal shape. Each metal strip has a wider width where the current flow is at its maximum and has a narrower width there the current flow is at its minimum. This either prevents the destruction of the chip or improves the reliability of the chip at higher current requirements.

In accordance with yet another aspect of this invention, by having two metal strps, the contacts for the drain and the contacts for the source can be moved away from the gate layout area which facilitates condensing the gate layout. By condensing the gate layout, a larger gate can be laid out in a same area as the area of the layout of a conventional design. Consequently, a MOSFET current driver of this design generates more current per unit area.

DESCRIPTION OF THE PREFERRED EMBODIMENT

Figure 1:
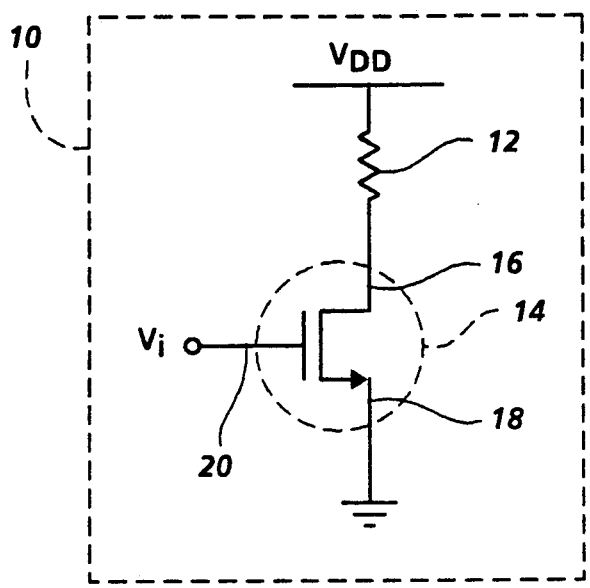
FIG. 1 is a circuit diagram of a prior art heating unit.
Figure 3:
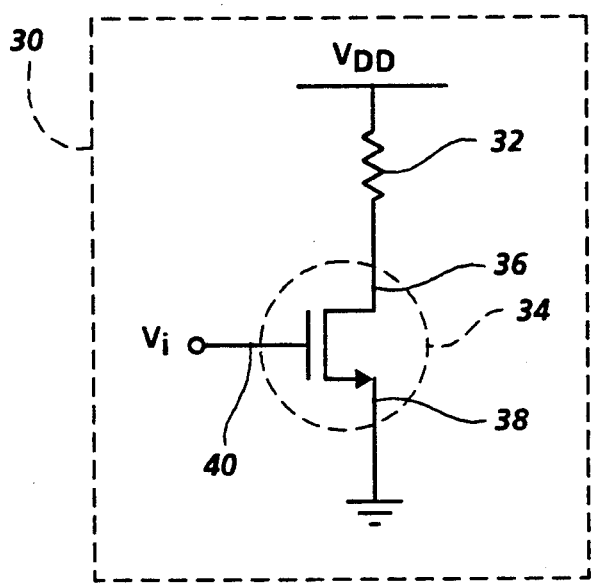
FIG. 3 is a circuit diagram of a heating unit of this invention.

Referring to FIG. 3, a heating unit 30 of this invention is shown which comprises a resistor 32 for heating and an n-channel MOSFET current driver 34. Drain 36 of the MOSFET 34 is connected to a power supply $V_{DD}$ through the resistor 32, source 38 of the MOSFET 34 is connected to ground potential, and gate 40 is connected to an input drive circuitry (not shown) through an input $V_i$.

Figure 4:
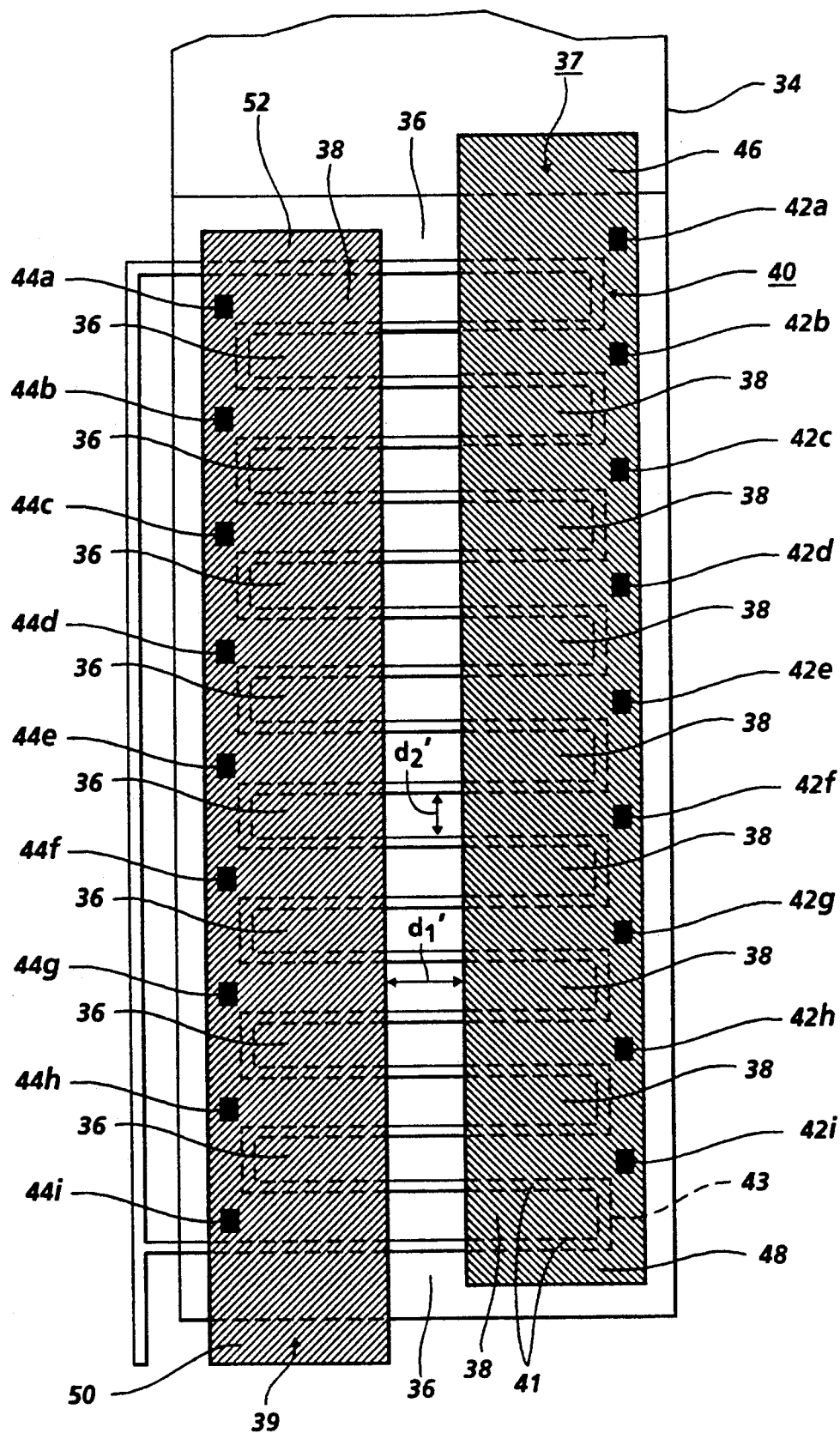
FIG. 4 is a layout of a current driver of this invention shown in FIG. 3.

Referring to FIG. 4, there is shown a layout of a MOSFET current driver 34 of this invention. In the design of the layout of this invention, the gate 40 is laid out to have a lateral serpentine pattern. The serpentine pattern is laid out to have a plurality of long strips 41 and a plurality of short strips 43. The long strips 41 are laid out parallel to each other along the width of the current driver 34. The short strips 39 are laid out to connect the long strips to each other in such a manner to generate a long continuous gate. The serpentine pattern of this design is called lateral since the long strips 41 are laid out along the width of the current driver 34. The drain areas 36 and source areas 38 are located between the long strips 41 of the gate 40 in an interlace form.

Also, in the layout of this invention there are only two metal strips which substantially overlap the serpentine patterned gate; one serves as the drain metal 37 and the second serves as the source metal 39. The drain metal has a plurality of drain contacts 42a, 42b, 42c, 42d and 42e and the source metal has a plurality of source contacts 44a, 44b, 44c, 44d and 44e. Each drain contact is placed on a drain area 36 to connect the drain metal 37 to the drain area 36 and each source contact is placed on a source area 38 to connect the source metal 39 to the source area 38.

Referring back to FIG. 2, in the prior art, the metal fingers should have a minimum distance $d_1$ separation between them. The minimum distance depends on the design rules of each technology. Each long strip 21 of the gate 20 has a corresponding drain area 16 and a corresponding source area 18. The long strips 21 of the gate 20 must be laid out to be between a drain finger 22 and a source finger 24.

In operation, the current from the drain metal 17 is distributed to the drain fingers 22 and each drain finger 22 sends the current into the corresponding drain 16 via the drain contacts 26. The current from the corresponding drain 16 flows into the corresponding source 18 and source fingers 24 collect the source current flows via the source contacts 28 and send them to the source metal 19.

Since the long strips 21 of the gate 20 are between a drain finger 22 and a source finger 24, the distance $d_2$ between each two adjacent long strips 21 of the gate 20 is dependent on the distance $d_1$ between the metal fingers 22 and 24. Therefore, the gate can not be laid out to have a more condense pattern with shorter distance between the long strips 21 of the gate 20. In this design, if more current capability is desired, the only way to have a larger gate is to elongate the longer strips 21 of the gate 20 which in turn causes the layout area to grow.

Referring to FIG. 4, in this invention, the contacts on the metal fingers of the prior art are moved from within the serpentine configuration to outside of the serpentine configuration i.e., 42a, 42b, 42c, 42d, 42e, 42f, 42g, 42h, 42i, 44a, 44b, 44c, 44d, 44e, 44f, 44g, 44h and 44i. Since the contacts are moved out of the gate layout area, the gate can be laid out to have a closer distance between the long strips 41 of the gate 40. Therefore, for the same area as in the prior art, a larger gate with can be laid out which generates more current. The gate of this design is ¼ to ⅛ larger than the gate of a conventional design. In comparison to the layout of the prior art, this layout generates more current per unit area due to the larger gate. This layout generates a current flow which is higher than the current flow generated by the prior art layout with the same layout area.

Figure 2:
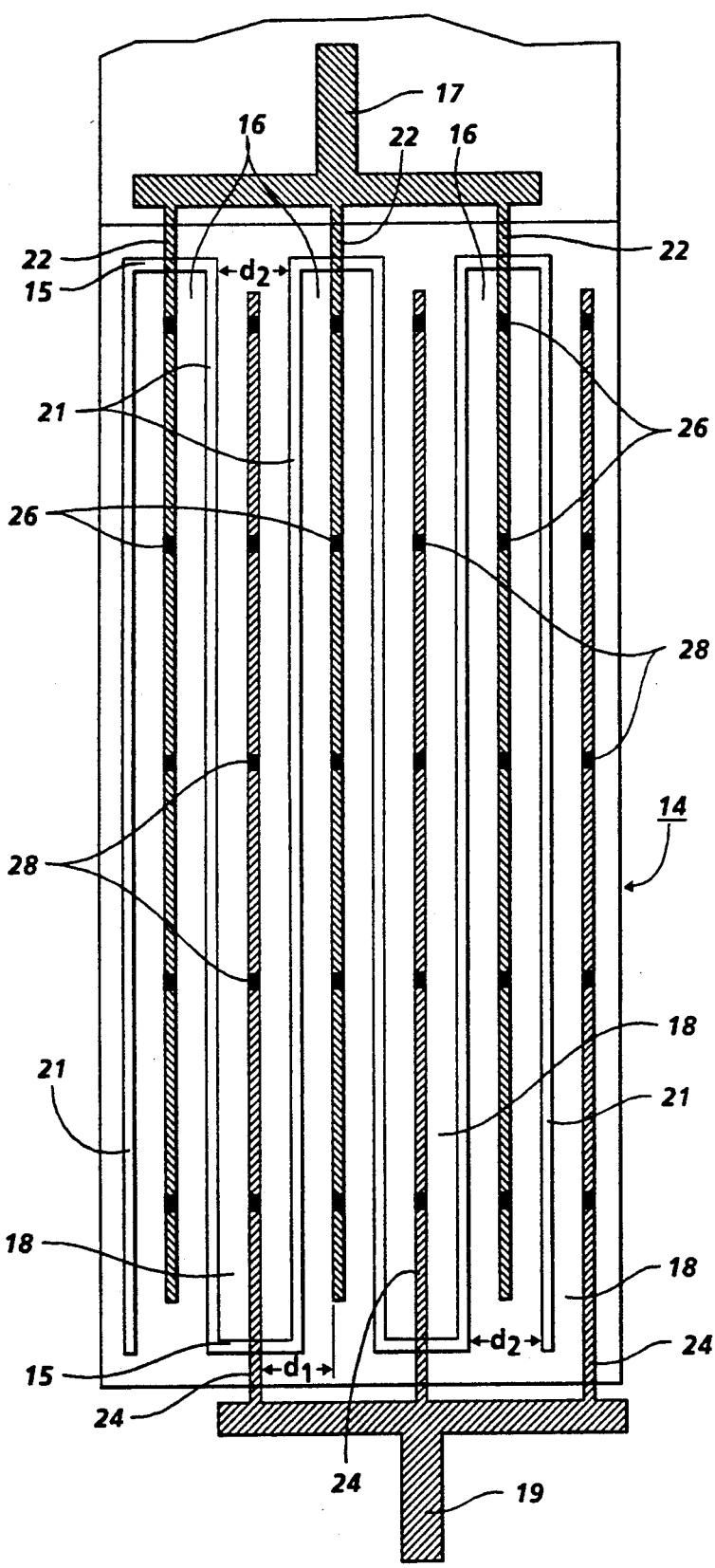
FIG. 2 is a prior art layout of a current driver shown in FIG. 1.

Again, as in the prior art, the distance $d_1'$ between the drain metal 37 and the source metal 39 depends on the design rules of each technology and is the same as the distance $d_1$ between the metal fingers 22 and 24 (FIG. 2). Since in this invention the width of the layout is limited, it is very important to use as much as possible of the layout area. Therefore, the distance $d_1'$ between the drain metal 37 and the source metal 39 should be kept as small as possible which is the minimum space that is allowed by the design rules of each technology. The distance between the source metal and the drain metal, in its present design with 3 micron NMOS technology, is 5.5 micron. Contrary to the prior art in which the distance $d_2$ is determined by the metal fingers, the distance between the gate strips $d_2'$ of this invention depends on the design rules of each technology.

In operation, the current from the drain metal 37 is distributed to the drain contacts 42a through 42i and each drain contact sends the current into the drain area 36. The current from the drain area 36 flows into the source area 38 and source metal 39 collects the source current flow via the source contacts 44a through 44i.

The amount of the current flow in the drain metal at the end 46 which is closer to the power supply is more than the amount of the current flow in the drain metal at the end 48. The reason is that the current flow in the drain metal is distributed between the drain contacts 42a through 42i to be collected at the source contacts 44a through 44i. Drain contact 42a sends a portion of the current flow to source contact 44a. Therefore, contact 42b receives less current flow compared to contact 42a. In the same manner, drain contact 42c receives less current flow than drain contact 42b and as the current moves from contact 42c to contact 42i, each contact receives less current than the previous contact.

Also, the amount of the current flow in the source metal at the end 50 which is closer to ground potential is more than the amount of the current flow in the source metal 38 at the end 52. The reason is that at the source metal 38, source contact 44a collects the current flow from drain contact 42a. The source contact 44b collects the current flow form source contact 44a and from drain contact 42b. Therefore, source contact 44b collects more current than source contact 44a. In the same manner source contact 44c collects more current than source contact 44b and moving from contact 44c to contact 44i, each contact collects more current than the previous contact.

As the power requirements increase so does the current the driver must supply. Each metal strip can handle a certain amount of current flow depending on its width. In thid design, due to the layout of the gate a high current in the range of of 190-250 mA for a 300 DPI printing and 75-125 mA for a 600 DPI printing is generated which is more than the amount of current that each of these strips 37, 39 can handle. Having a high current concentrated at drain end 46 and at the source end 50, could cause the drain end 46 and the source end 50 to melt and even if they do not melt the electromigration will be very high which would shorten the life of the current driver. To meet the high current requirements and to avoid the possibility of the melting problem, the layout in FIG. 4 has been modified to the layout shown in FIG. 5.

Figure 5:
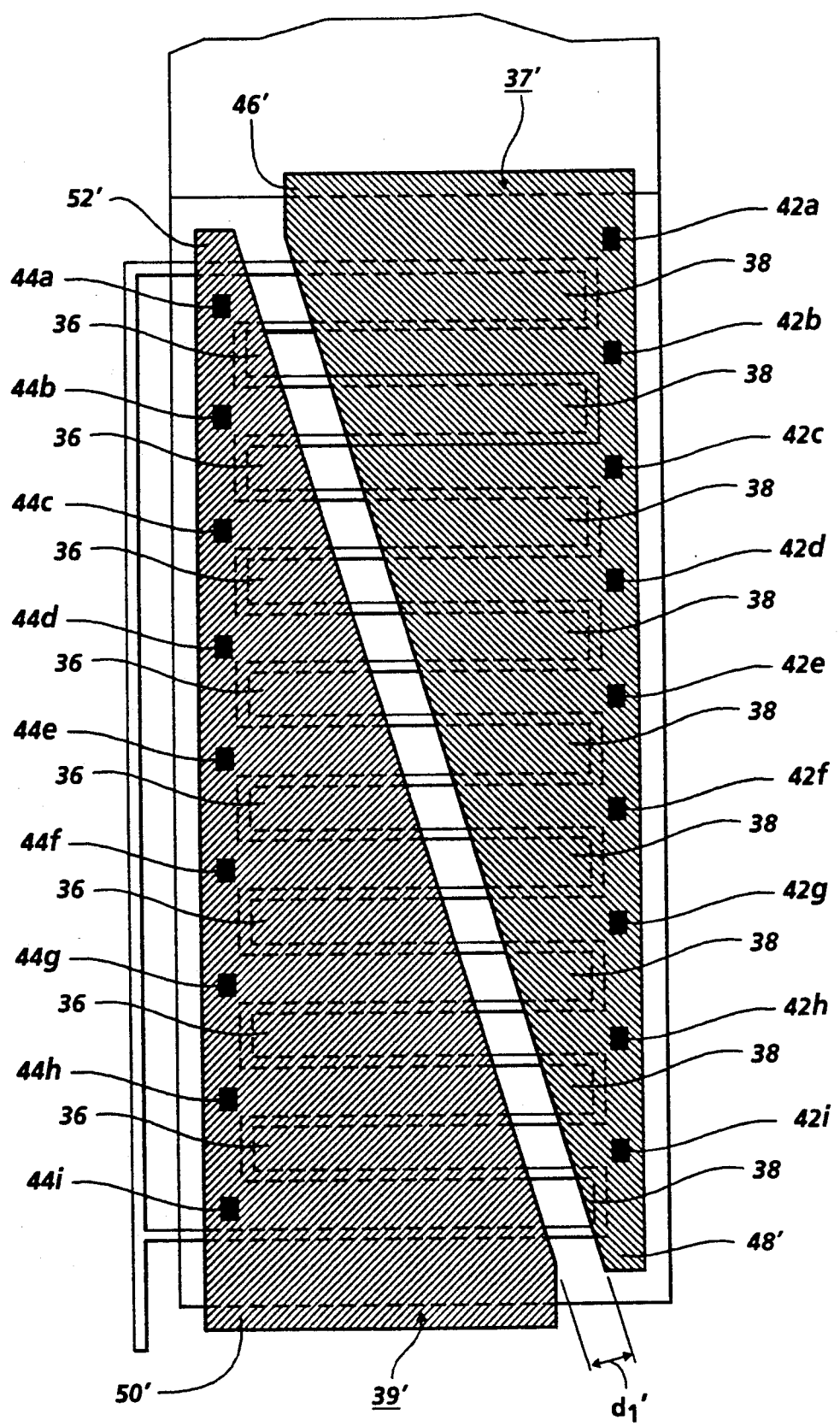
FIG. 5 is an improved layout of a current driver of this invention.

Referring to FIG. 5, drain metal 37' and the source metal 39' have trapezoidal shapes. The drain metal 37' is wider at the end 46' where the current has the maximum flow and the drain metal 37' is narrower at the end 48' where the current has the minimum flow. In the same manner, the source metal 39' is wider at the end 50' where the current has the maximum flow and the source metal 39' is narrower at the end 52' where the current has the minimum flow. This configuration is capable of handling a high current flow in the range of 190–250 mA for a 300 DPI printing and 75–125 mA for a 600 DPI printing which is 25–30% improvement over the prior art layout with the same layout area.

It should be understood that the design of the current driver layout of this invention is disclosed for an n-channel MOSFET (NMOS). However, the layout of this invention can be applied to a PMOS current driver or it can be applied to any current driver utilizing CMOS, BICMOS or Bipolar technologies.

This invention reduces the problem of the multiplicity of spaces between the metal fingers of the prior art which increases the probability of a short or defect between the metal fingers. In this invention, there is only one space between the two strips of the drain metal 37' and the source metal 39' which reduces the probability of a short or defect between the drain metal 37' and the source metal 39'. The layout disclosed in this embodiment has a higher fabrication yield due to the fact that there is only one space between the drain metal (37') and source metal (39'). Also, the layout of this design generates more current per unit area which provides a higher current drive capability.

What is claimed is:

1. A layout of a MOSFET current driver comprising:
   a drain metal strip;
   a source metal strip;
   said layout having a length and a width;
   said drain metal strip and said source metal strip being closely adjacent to, but spaced from each other and extending generally in the direction of said length of said layout;
   said drain metal strip and said source metal strip each having a first end and a second end;
   said first end of said drain metal strip being adjacent to said first end of said source metal strip and said second end of said drain metal strip being adjacent to said second end of said source metal strip;
   said drain metal strip being wider at said first end and being narrower at said second end and said source metal strip being narrower at the said first end and being wider at said second end;
   a gate having a serpentine pattern;
   said serpentine pattern having a plurality of long strips and a plurality of short strips;
   said long strips being generally parallel to each other and extending generally in the direction of said width of said layout;
   said short strips connecting said long strips in such a manner as to generate a long continuous gate;
   said drain metal strip substantially overlapping said serpentine patterned gate;
   said source metal strip substantially overlapping said serpentine patterned gate;
   a plurality of drain areas;
   a plurality of source areas;
   each of said plurality of said drain areas being located between two adjacent long strips of said gate and each of said plurality of said source areas being located between two adjacent long strips of said gate;
   said drain areas and said source areas being so constructed and arranged relative to each other and to said long strips of said gate to be in an interlace form with each other;
   said drain metal strip having a plurality of drain contacts along said length of said layout on one side of said serpentine pattern;
   each of said plurality of said drain contacts being located on a respective one of said drain areas and connecting said drain metal strip to its respective drain area;
   said source metal strip having a plurality of source contacts along said length of said layout on the opposite side of said serpentine pattern; and
   each of said plurality of said source contacts being located on a respective one of said source areas and connecting said source metal strip to its respective said one source areas.

2. The layout as recited in claim 1, wherein said drain metal strip progressively decreases from said first end to said second end and said source metal strip progressively decreases from said second end to said first end.

3. The layout as recited in claim 2, further comprising;
   a power supply;
   a heating element; and
   said drain metal strip being connected to said power supply through said heating element.

4. The layout as recited in claim 3, wherein said heating element is a resistor.

* * * * *